(12) United States Patent
Ushijima et al.

(10) Patent No.: US 10,966,348 B2
(45) Date of Patent: Mar. 30, 2021

(54) SEMICONDUCTOR COOLING DEVICE, POWER CONTROL SYSTEM AND TRAVELLING BODY INCLUDING A SEMICONDUCTOR COLLING DEVICE WITH MICROBUBBLE GENERATOR

(71) Applicant: Mitsubishi Electric Corporation, Tokyo (JP)

(72) Inventors: Koichi Ushijima, Fukuoka (JP); Shoji Saito, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/481,049

(22) PCT Filed: Apr. 4, 2017

(86) PCT No.: PCT/JP2017/014015
§ 371 (c)(1),
(2) Date: Jul. 25, 2019

(87) PCT Pub. No.: WO2018/185822
PCT Pub. Date: Oct. 11, 2018

(65) Prior Publication Data
US 2020/0243419 A1    Jul. 30, 2020

(51) Int. Cl.
*H05K 7/20* (2006.01)
*H01L 23/473* (2006.01)
(Continued)

(52) U.S. Cl.
CPC ....... *H05K 7/20272* (2013.01); *H01L 23/473* (2013.01); *H01L 23/58* (2013.01); *H05K 7/20927* (2013.01); *H05K 7/20945* (2013.01)

(58) Field of Classification Search
CPC ........... H05K 7/20218; H05K 7/20272; H05K 7/20281; H05K 7/20927; H01L 23/473
See application file for complete search history.

(56) References Cited

U.S. PATENT DOCUMENTS 6,564,861 B1 * 5/2003 Miyazaki ............ F28D 15/0266
  165/104.21
2001/0040022 A1 * 11/2001 Hao ........................ F28F 13/00
  165/80.3
(Continued)

FOREIGN PATENT DOCUMENTS

JP    2006-166604 A    6/2006
JP    2009-044100 A    2/2009

OTHER PUBLICATIONS

International Search Report issued in PCT/JP2017/014015; dated Jun. 13, 2017.

*Primary Examiner* — Zachary Pape
(74) *Attorney, Agent, or Firm* — Studebaker & Brackett PC

(57) ABSTRACT

An object is to provide a semiconductor cooling device which optimally keeps the mixing amount of microbubbles in the refrigerant and prevents the reduction of the cooling effect of the semiconductor module. The semiconductor cooling device includes a refrigerant circulation path through which refrigerant circulates, a heat exchanger provided on the refrigerant circulation path on which a semiconductor module is installable and configured to exchange heat between the refrigerant and the semiconductor module, a microbubble generator provided on the refrigerant circulation path, and configured to generate microbubbles in the refrigerant, a controller configured to control the microbubble generator, and a refrigerant sensor configured to measure a temperature, a flow rate, a flow velocity, or a pressure of the refrigerant circulating in the refrigerant circulation path. The controller is configured to control the microbubble generator based on a measurement result measured by the refrigerant sensor to control the generation amount of microbubbles.

8 Claims, 8 Drawing Sheets

(51) Int. Cl.
*B60K 11/02* (2006.01)
*H01L 23/58* (2006.01)

(56) References Cited

U.S. PATENT DOCUMENTS

| | | | |
|---|---|---|---|
| 2005/0279491 A1* | 12/2005 | Thome | F28D 15/0266 |
| | | | 165/272 |
| 2009/0044928 A1* | 2/2009 | Upadhya | F28F 3/12 |
| | | | 165/81 |
| 2014/0198450 A1* | 7/2014 | Baba | H05K 7/20927 |
| | | | 361/689 |
| 2018/0287337 A1* | 10/2018 | Takazane | B23K 26/703 |
| 2019/0186843 A1* | 6/2019 | Takeuchi | H01M 10/6569 |
| 2020/0018554 A1* | 1/2020 | Ipposhi | F28D 15/025 |

* cited by examiner

SEMICONDUCTOR COOLING DEVICE, POWER CONTROL SYSTEM AND TRAVELLING BODY INCLUDING A SEMICONDUCTOR COLLING DEVICE WITH MICROBUBBLE GENERATOR

TECHNICAL FIELD

The present invention relates to a semiconductor cooling device, a power control system and a travelling body.

BACKGROUND ART

In order to improve the reliability of a semiconductor module, the semiconductor module needs to be efficiently cooled. For example, the power conversion device described in Patent Document 1 adopts a water cooling type cooling method for cooling a semiconductor module.

Also, the temperature control apparatus which controls the temperature of an object to be temperature-controlled with liquid refrigerant containing microbubbles is proposed in Patent Document 2.

PRIOR ART DOCUMENTS

Patent Documents

[Patent Document 1] Japanese Patent Application Laid-Open No. 2006-166604
[Patent Document 2] Japanese Patent Application Laid-Open No. 2009-44100

SUMMARY

Problem to be Solved by the Invention

The microbubbles mixed in the liquid refrigerant reduce the pressure loss of the refrigerant. However, the liquid refrigerant containing microbubbles has a problem in that the concentration of the microbubbles in the refrigerant decreases with time due to collapse of the microbubbles or the like, and the pressure loss reduction effect and the heat radiation improvement effect decrease. On the other hand, when the concentration of the microbubbles is excessive, the microbubbles rupture or scatter to generate air bubbles in the refrigerant flow path, and the heat radiation effect is reduced. If a microbubble generator does not have the function of controlling the generation amount of microbubbles supplied into the refrigerant flow path, the pressure loss reduction effect and the heat radiation improvement effect cannot be recovered.

The present invention has been made to solve the problems as described above, and an object of the present invention is to provide a semiconductor cooling device which optimally keeps the mixing amount of microbubbles in the refrigerant and prevents the reduction of the cooling effect of the semiconductor module.

Means to Solve the Problem

The semiconductor cooling device according to the present invention includes a refrigerant circulation path through which refrigerant circulates, a heat exchanger provided on the refrigerant circulation path on which a semiconductor module is installable and configured to exchange heat between the refrigerant and the semiconductor module, a microbubble generator provided on the refrigerant circulation path, and configured to generate microbubbles in the refrigerant, a controller configured to control the microbubble generator, and a refrigerant sensor configured to measure a refrigerant temperature, a refrigerant flow rate, a refrigerant flow velocity, or a refrigerant pressure of the refrigerant circulating the refrigerant circulation path. The controller is configured to control the microbubble generator based on a measurement result measured by the refrigerant sensor to control the generation amount of microbubbles.

Effects of the Invention

A semiconductor cooling device which optimally keeps the mixing amount of microbubbles in the refrigerant and prevents the reduction of the cooling effect of the semiconductor module is provided.

These and other objects, features, aspects and advantages of the present invention will become more apparent from the following detailed description of the present invention when taken in conjunction with the accompanying drawings.

DESCRIPTION OF EMBODIMENTS

Before describing Embodiments of the semiconductor cooling device according to the present invention, the underlying technology of the present invention will be described.

Figure 1:
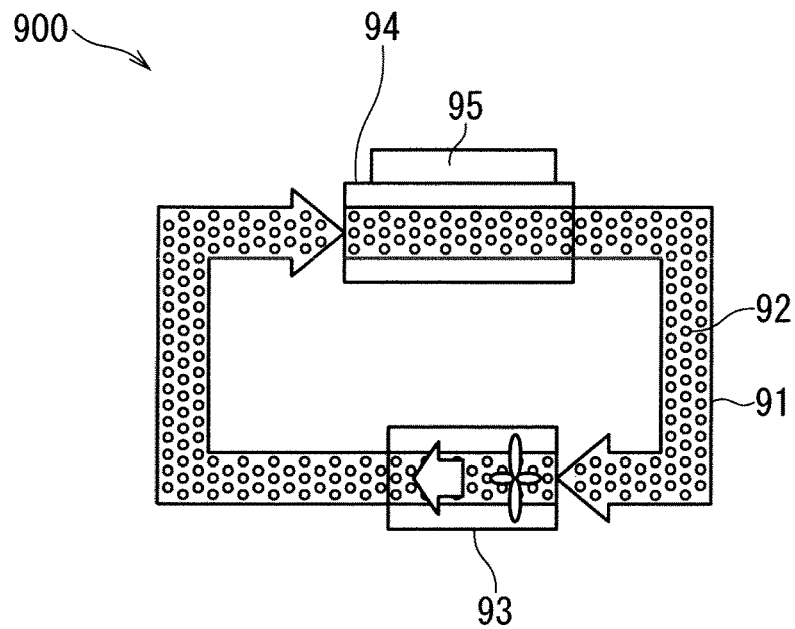
FIG. 1 A diagram schematically illustrating a configuration of a semiconductor cooling device according to an underlying technology.

FIG. 1 is a diagram schematically illustrating a configuration of a semiconductor cooling device 900 according to an underlying technology of the present invention. The semiconductor cooling device 900 includes a refrigerant circulation path 91 through which refrigerant 92 containing microbubbles circulates, a circulator 93 that circulates the refrigerant 92 through the refrigerant circulation path 91, and cooling fins 94. The cooling fins 94 exchange heat between the refrigerant 92 and the semiconductor module 95 installed on the cooling fins 94. The microbubbles reduce fluid friction of the refrigerant 92 and reduce pressure loss of the refrigerant 92. The semiconductor cooling device 900 enables to increase the flow velocity of the refrigerant 2, so the thermal resistance Rth (j_w) between the semiconductor module 5 and the refrigerant 2 is reduced, and as a result, the heat radiation effect is improved.

The semiconductor cooling device in each Embodiment described below has the effect of optimally keeping the mixing amount of the microbubbles in the refrigerant and preventing the reduction of the cooling effect on the semiconductor module, in addition to the effects of the above-mentioned semiconductor cooling device 900.

Embodiment 1

Figure 2:
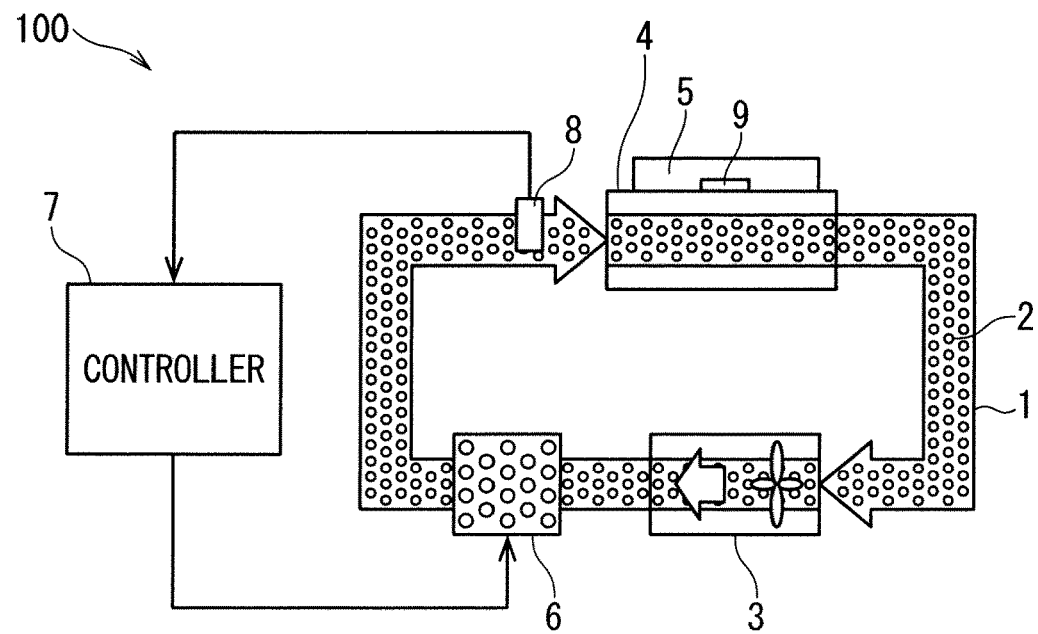
FIG. 2 A diagram schematically illustrating a configuration of a semiconductor cooling device according to Embodiment 1.

FIG. 2 is a diagram schematically illustrating a configuration of a semiconductor cooling device 100 according to Embodiment 1.

The semiconductor cooling device 100 includes a refrigerant circulation path 1 through which refrigerant 2 circulates, a circulator 3, a refrigerant sensor that measures the physical state of the refrigerant 2, that is, a refrigerant temperature sensor 8 in Embodiment 1, cooling fins 4 that is a heat exchanger, a module temperature sensor 9, a microbubble generator 6, and a controller 7.

The refrigerant 2 is refrigerant including microbubbles, for example, a mixture of antifreeze liquid (LLC) and water with the microbubbles.

The circulator 3 is disposed in the refrigerant circulation path 1 and circulates the refrigerant 2 through the refrigerant circulation path 1.

The refrigerant temperature sensor 8 is provided at the inlet or the outlet of the cooling fins 4 of the refrigerant circulation path 1 and measures the refrigerant temperature Tw. In Embodiment 1, the refrigerant temperature sensor 8 is disposed at the inlet of the cooling fins 4.

The cooling fins 4 being a heat exchanger are disposed in the refrigerant circulation path 1 and exchanges heat between the refrigerant 2 and the semiconductor module 5. For example, one side of the cooling fins 4 are disposed in contact with the refrigerant 2 in the refrigerant circulation path 1, and the semiconductor module 5 is installed on the other side. It should be noted that, the cooling fins 4 are an example of a heat exchanger, and the heat exchanger is not limited to the cooling fins 4.

The semiconductor module 5 is, for example, a power semiconductor module, and includes a semiconductor device containing Si, SiC or GaN as a main material. The semiconductor device includes, for example, MOSFET or IGBT.

The module temperature sensor 9 measures a module temperature Tj of the semiconductor module 5 disposed on the cooling fins 4. The module temperature sensor 9 is disposed, for example, on one side of the cooling fins 4 on which the semiconductor module 5 is disposed. The module temperature Tj measured by the module temperature sensor 9 is preferably the temperature of the semiconductor device, and more preferably the temperature of the junction of the semiconductor device.

The microbubble generator 6 generates microbubbles to be mixed in the refrigerant 2.

Although not shown, the controller 7 includes a processor that performs various arithmetic processing and determination processing, and a memory that stores various data. The controller 7 controls the microbubble generator 6 to control the generation amount of microbubbles. In Embodiment 1, the controller 7 controls the output of the microbubble generator 6 based on the refrigerant temperature Tw measured by the refrigerant temperature sensor 8 and the module temperature Tj measured by the module temperature sensor 9.

Although not shown here, the controller 7 may be provided with an input terminal for inputting a signal related to the module temperature Tj of the semiconductor module 5 instead of the module temperature sensor 9 described above. The input terminal receives, for example, a signal output from the module temperature sensor disposed on the semiconductor module 5. The signal may be a signal including a value of the module temperature Tj, or may be a signal indicating that the module temperature Tj is higher or lower than a predetermined value. The controller 7 controls the microbubble generator 6 based on the refrigerant temperature Tw measured by the refrigerant temperature sensor 8 and the signal input from the input terminal.

Figure 3:
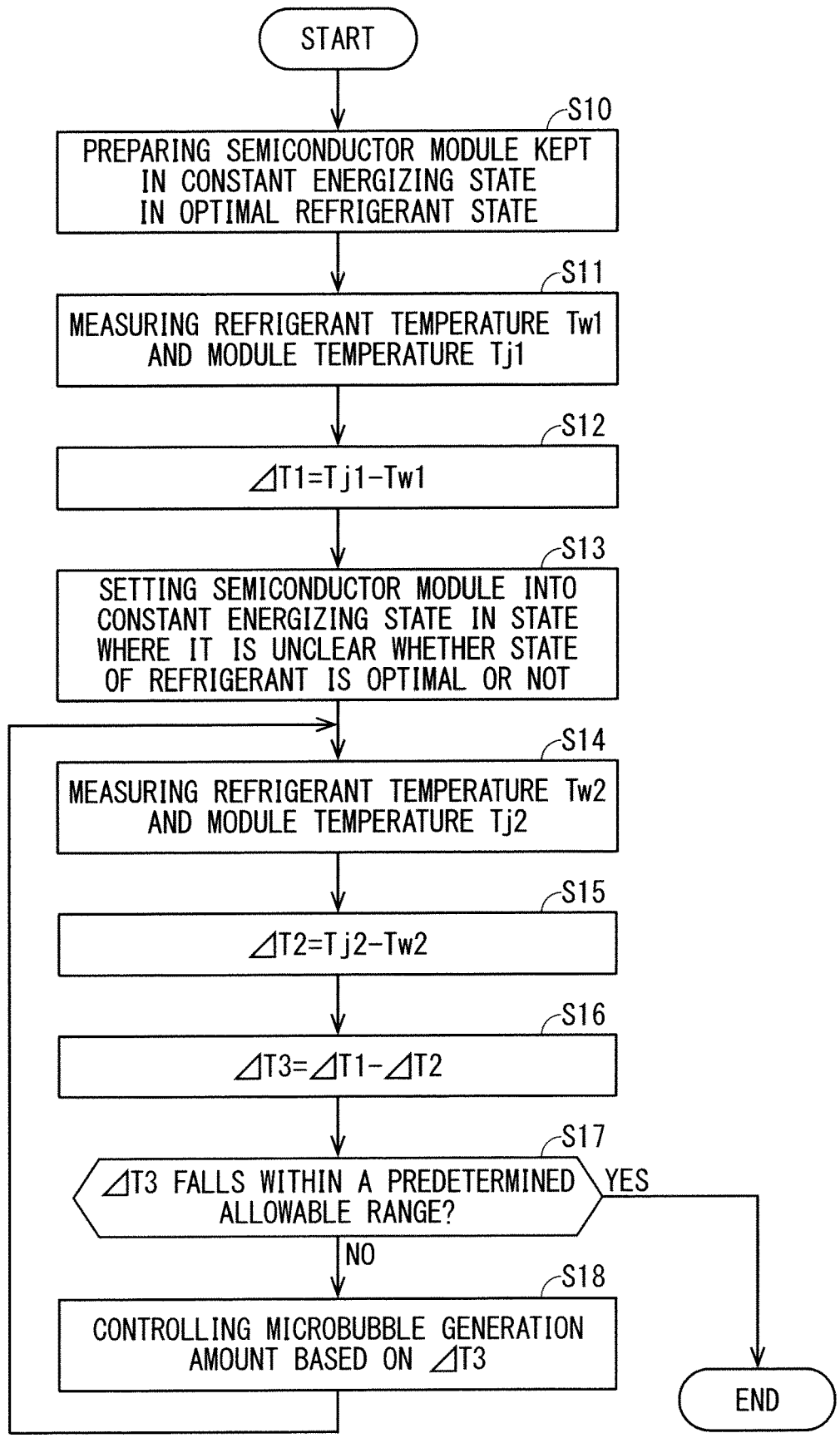
FIG. 3 A flowchart illustrating a control method of a mixing amount of microbubbles according to Embodiment 1.

Next, an operation of the semiconductor cooling device 100 and a control method of the mixing amount of microbubbles will be described. FIG. 3 is a flowchart illustrating the control method of the mixing amount of microbubbles according to Embodiment 1.

First, in Step S10, a state in which the mixing amount of microbubbles contained in the refrigerant 2 is optimal is prepared. In the optimal state of the refrigerant 2, the semiconductor module 5 is kept in a given constant energizing state.

In Step S11, the controller 7 obtains the refrigerant temperature Tw1 measured by the refrigerant temperature sensor 8 and the module temperature Tj1 measured by the module temperature sensor 9.

In Step S12, the controller 7 calculates $\Delta T1 = Tj1 - Tw1$, which is the temperature difference between the refrigerant temperature Tw1 and the module temperature Tj1, and stores the temperature difference in the memory as reference data. $\Delta T1$ indicates the magnitude of the cooling effect in a state where the mixing amount of the microbubbles is optimal.

In step S13, in a state where it is unclear whether the state of the refrigerant 2 is optimal or not, that is, the state of the mixing amount of the microbubbles is optimal or not, since the time has elapsed from Step S11, the semiconductor module 5 is driven in the same state as the constant energizing state in which the reference data is acquired.

In Step S14, the controller 7 obtains the refrigerant temperature Tw2 measured by the refrigerant temperature sensor 8 and the module temperature Tj2 measured by the module temperature sensor 9.

In Step S15, the controller 7 calculates $\Delta T2 = Tj2 - Tw2$, which is the temperature difference between the refrigerant temperature Tw2 and the module temperature Tj2.

In Step S16, the controller 7 reads out, from the memory, $\Delta T1$ calculated in a state in which the microbubbles contained in the refrigerant 2 are optimal. The controller 7 calculates $\Delta T3 = \Delta T1 - \Delta T2$ with $\Delta T2$ calculated in the state where it is unclear whether the state of the refrigerant 2 is optimal or not and $\Delta T1$. When the mixing amount of the microbubbles is not in the optimum state, a difference occurs between $\Delta T1$ and $\Delta T2$. For example, as the cooling effect of the refrigerant 2 decreases, $\Delta T3$ increases.

In Step S17, the controller 7 determines whether the calculated ΔT3 falls within a predetermined allowable range or not. When ΔT3 falls within the allowable range, that is, YES in Step S17, the control method is ended. When ΔT3 exceeds the allowable range, that is, NO in Step S17, the control method proceeds to Step S18.

Figure 4:
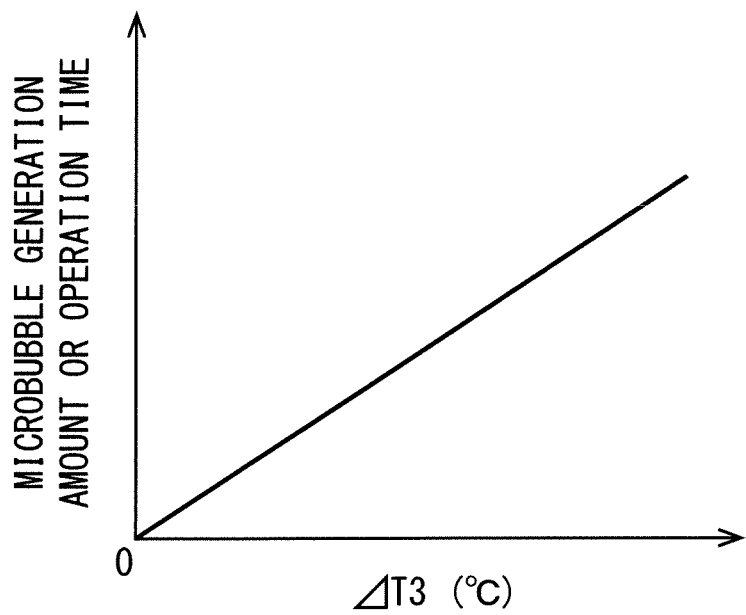
FIG. 4 A graph illustrating a relation between a microbubble generation amount and $\Delta T3$ according to Embodiment 1.

In Step S18, the controller 7 drives the microbubble generator 6. FIG. 4 is a graph illustrating a correlation between ΔT3 and the microbubble generation amount or the operation time of the microbubble generator 6 for making the microbubbles the optimal mixing amount. Based on the correlation, the controller 7 controls the generation amount of microbubbles in accordance with ΔT3. As a result, the mixing amount of microbubbles contained in the refrigerant 2 recovers to the optimal state. After the control of the microbubbles in step S18, the present control method may be ended, or, the method may proceed to Step S14 again to confirm whether ΔT3 converges in the allowable range as illustrated in FIG. 3.

Summarizing above, the semiconductor cooling device 100 according to Embodiment 1 includes the refrigerant circulation path 1 through which the refrigerant 2 circulates, the cooling fins 4 disposed on the refrigerant circulation path 1 on which the semiconductor module 5 is installable and being a heat exchanger exchanging heat between the refrigerant 2 and the semiconductor module 5, the microbubble generator 6 disposed on the refrigerant circulation path 1 and generating microbubbles in the refrigerant 2, the controller 7 controlling the microbubble generator 6, and the refrigerant sensor measuring the state of the refrigerant 2 circulating the refrigerant circulation path 1. In Embodiment 1, the refrigerant sensor represents the refrigerant temperature sensor 8 that measures a refrigerant temperature Tw.

The semiconductor cooling device 100 further includes a module temperature sensor 9 that measures a module temperature Tj of the semiconductor module 5 that is installable in the cooling fins 4 that is a heat exchanger. The controller 7 controls the microbubble generator 6 based on the refrigerant temperature Tw of the refrigerant 2 measured by the refrigerant temperature sensor 8 and the module temperature Tj of the semiconductor module 5 measured by the module temperature sensor 9.

Alternatively, the controller 7 further includes an input terminal for inputting a signal related to the module temperature Tj of the semiconductor module 5 that is installable in the heat exchanger. The controller 7 controls the microbubble generator 6 based on the refrigerant temperature Tw measured by the refrigerant temperature sensor 8 and the signal input from the input terminal.

With the configuration as described above, the semiconductor cooling device 100 keeps the mixing amount of the microbubbles contained in the refrigerant 2 in the optimal state. That is, the semiconductor cooling device 100 reduces the pressure loss of the refrigerant 2 and ensures to increase the flow velocity of the refrigerant 2. As a result, the thermal resistance Rth (j_w) between the semiconductor module 5 and the refrigerant 2 is reduced, and the heat radiation effect is improved.

Embodiment 2

A semiconductor cooling device according to Embodiment 2 will be described. Descriptions of configurations and operations similar to those of Embodiment 1 will be omitted.

Figure 5:
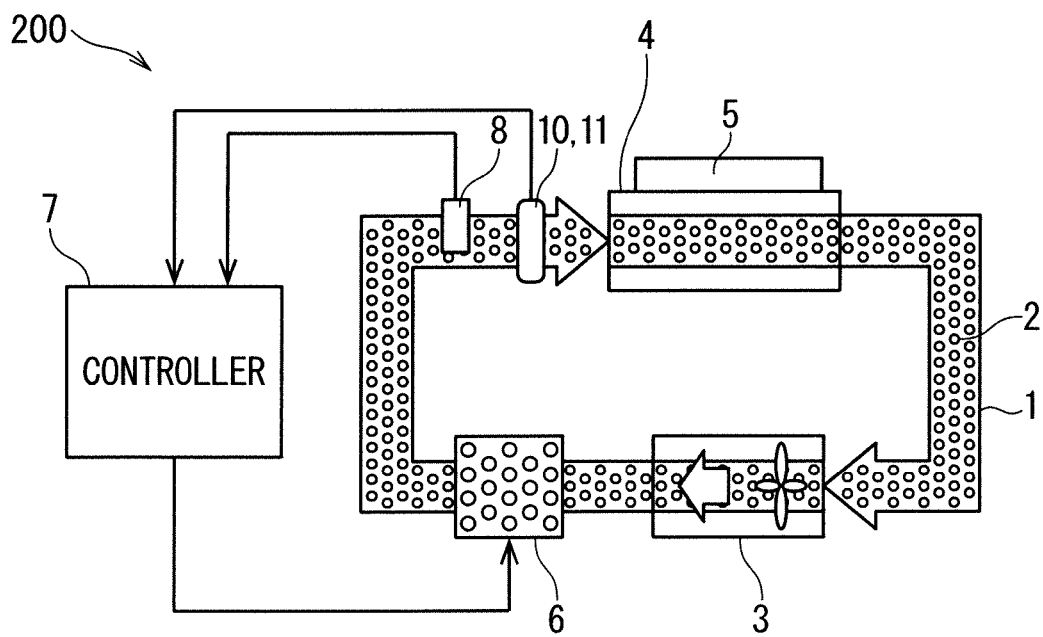
FIG. 5 A diagram schematically illustrating a configuration of a semiconductor cooling device according to Embodiment 2.

FIG. 5 is a diagram schematically illustrating a configuration of a semiconductor cooling device 200 according to Embodiment 2. The semiconductor cooling device 200 is provided, at arbitrary positions of the refrigerant circulation path 1, with a refrigerant temperature sensor 8 that detects a refrigerant temperature Tw, and a refrigerant flow rate sensor 10 that measures the refrigerant flow rate L or a refrigerant flow velocity sensor 11 that measures the refrigerant flow velocity V. The refrigerant temperature sensor 8 is preferably disposed in the immediate vicinity of the refrigerant flow rate sensor 10 or the refrigerant flow velocity sensor 11. The refrigerant temperature Tw and the refrigerant flow rate L or the refrigerant flow velocity V measured in such an arrangement reduce measurement errors due to the dispersion of the physical states of the refrigerant 2 related to the positions in the refrigerant circulation path 1.

The controller 7 controls the output of the microbubble generator 6 based on the refrigerant temperature Tw and the refrigerant flow rate L or the refrigerant flow velocity V.

Figure 6:
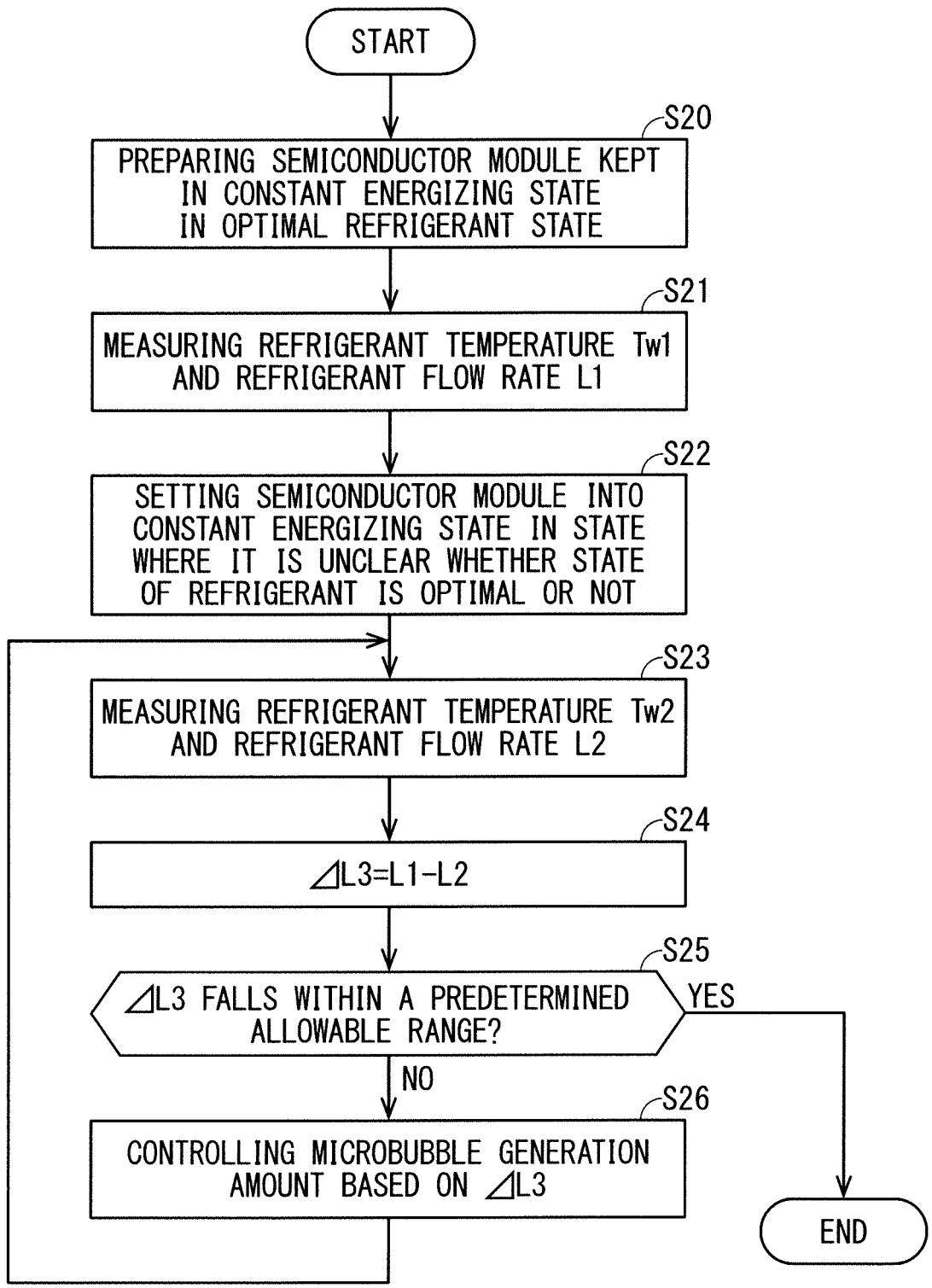
FIG. 6 A flowchart illustrating a control method of a mixing amount of microbubbles according to Embodiment 2.

Next, an operation of the semiconductor cooling device 200 and a control method of the mixing amount of microbubbles will be described. FIG. 6 is a flowchart illustrating the control method of the mixing amount of microbubbles according to Embodiment 2.

First, in Step S20, a state in which the mixing amount of microbubbles contained in the refrigerant 2 is optimal is prepared. In the state of the optimal refrigerant 2, the semiconductor module 5 is kept in a given constant energizing state.

In Step S21, the controller 7 obtains a refrigerant temperature Tw1 measured by the refrigerant temperature sensor 8, and a refrigerant flow rate L1 measured by the refrigerant flow rate sensor 10 or a refrigerant flow velocity V1 measured by the refrigerant flow velocity sensor 11. At this point, the controller 7 preferably obtains a plurality of refrigerant flow rates L1 or a plurality of refrigerant flow velocities V1 for a plurality of refrigerant temperatures Tw1. Therefore, the correlation between the refrigerant temperature Tw1 and the refrigerant flow rate L1, or the correlation between the refrigerant temperature Tw1 and the refrigerant flow velocity V1 in the optimal refrigerant state is obtained. The controller 7 stores correlation data between the acquired refrigerant temperature Tw1 and the refrigerant flow rate L1 or the refrigerant flow velocity V1 in the memory as reference data. It should be noted that, FIG. 6 illustrates each step in the case of measuring the refrigerant flow rate L.

In step S22, in a state where it is unclear whether the state of the refrigerant 2 is optimal or not, that is, the state of the mixing amount of the microbubbles is optimal or not, since the time has elapsed from Step S21, the semiconductor module 5 is driven in the same state as the constant energizing state in which the reference data is acquired.

In Step S23, the controller 7 obtains a refrigerant temperature Tw2 measured by the refrigerant temperature sensor 8, and a refrigerant flow rate L2 measured by the refrigerant flow rate sensor 10 or a refrigerant flow velocity V2 measured by the refrigerant flow velocity sensor 11.

In Step S24, the controller 7 reads out, from the memory, the refrigerant flow rate L1 measured in a state in which the microbubbles contained in the refrigerant 2 are optimal. The controller 7 calculates ΔL3=L1−L2 with the refrigerant flow rate L2 measured in the state where it is unclear whether the state of the refrigerant 2 is optimal or not and L1. The same applies to the control by the refrigerant flow velocity V, and the controller 7 reads out, from the memory, the refrigerant flow velocity V1 measured in the state where the microbubbles contained in the refrigerant 2 are optimal. The controller 7 calculates ΔV3=V1−V2 with the refrigerant flow velocity V2 measured in the state where it is unclear whether the state of the refrigerant 2 is optimal or not and V1. When the mixing amount of microbubbles is not in the optimum state, the pressure loss reduction effect by the microbubbles is reduced, so that $\Delta L3$ or $\Delta V3$ becomes large.

In Step S25, the controller 7 determines whether the calculated $\Delta L3$ or $\Delta V3$ falls within a predetermined allowable range or not. When $\Delta L3$ or $\Delta V3$ falls within the allowable range, that is, YES in Step S25, the control method is ended. When $\Delta L3$ or $\Delta V3$ exceeds the allowable range, that is, NO in Step S25, the control method proceeds to Step S26.

Figure 7:
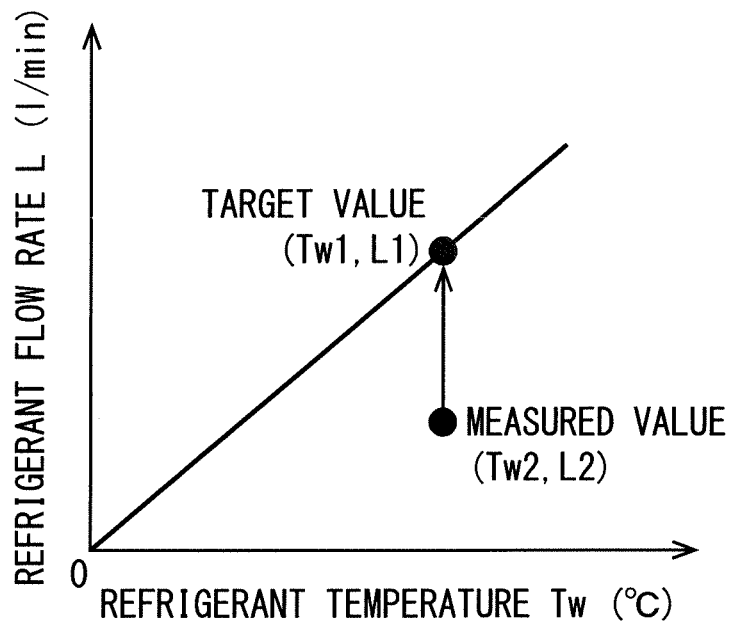
FIG. 7 A graph illustrating a correlation between a refrigerant temperature and a refrigerant flow rate in an optimal refrigerant state.

In Step S26, the controller 7 drives the microbubble generator 6. FIG. 7 illustrates a correlation between the refrigerant temperature Tw1 and a refrigerant flow rate L1 acquired in Step S21 in the optimal refrigerant state. Also, in FIG. 7, the refrigerant temperature Tw2 and the refrigerant flow rate L2 acquired in Step S23 are illustrated. The controller 7 controls the generation amount of microbubbles so that the values of the refrigerant temperature Tw2 and the refrigerant flow rate L2 approach the target value on the graph illustrating the relation between the refrigerant temperature Tw1 and the refrigerant flow rate L1. This control is repeatedly performed from Step S23 to Step S26 until the values converge in the allowable range including the target value. By performing such control, the mixing amount of microbubbles contained in the refrigerant 2 recovers to the optimal state. The same control as described above is also performed when the generation amount of microbubbles is controlled by the refrigerant flow velocity V1 and the refrigerant flow velocity V2.

Summarizing the above, the refrigerant sensor included in the semiconductor cooling device 200 according to Embodiment 2 includes the refrigerant temperature sensor 8 that measures the refrigerant temperature Tw and the refrigerant flow rate sensor 10 that measures the refrigerant flow rate L. The controller 7 controls the microbubble generator 6 based on the refrigerant temperature Tw measured by the refrigerant temperature sensor 8 and the refrigerant flow rate L measured by the refrigerant flow rate sensor 10.

Alternatively, the refrigerant sensor included in the semiconductor cooling device 200 includes the refrigerant temperature sensor 8 that measures the refrigerant temperature Tw and the refrigerant flow velocity sensor 11 that measures the refrigerant flow velocity V. The controller 7 controls the microbubble generator 6 based on the refrigerant temperature Tw measured by the refrigerant temperature sensor 8 and the refrigerant flow velocity V measured by the refrigerant flow velocity sensor 11.

With such a configuration, the semiconductor cooling device 200 keeps the mixing amount of the microbubbles contained in the refrigerant 2 in the optimal state. That is, the semiconductor cooling device 200 reduces the pressure loss of the refrigerant 2 and ensures to increase the flow velocity of the refrigerant 2. As a result, the thermal resistance Rth (j_w) between the semiconductor module 5 and the refrigerant 2 is reduced, and the heat radiation effect is improved.

Embodiment 3

A semiconductor cooling device according to Embodiment 3 will be described. Descriptions of configurations and operations similar to those of Embodiment 1 will be omitted.

Figure 8:
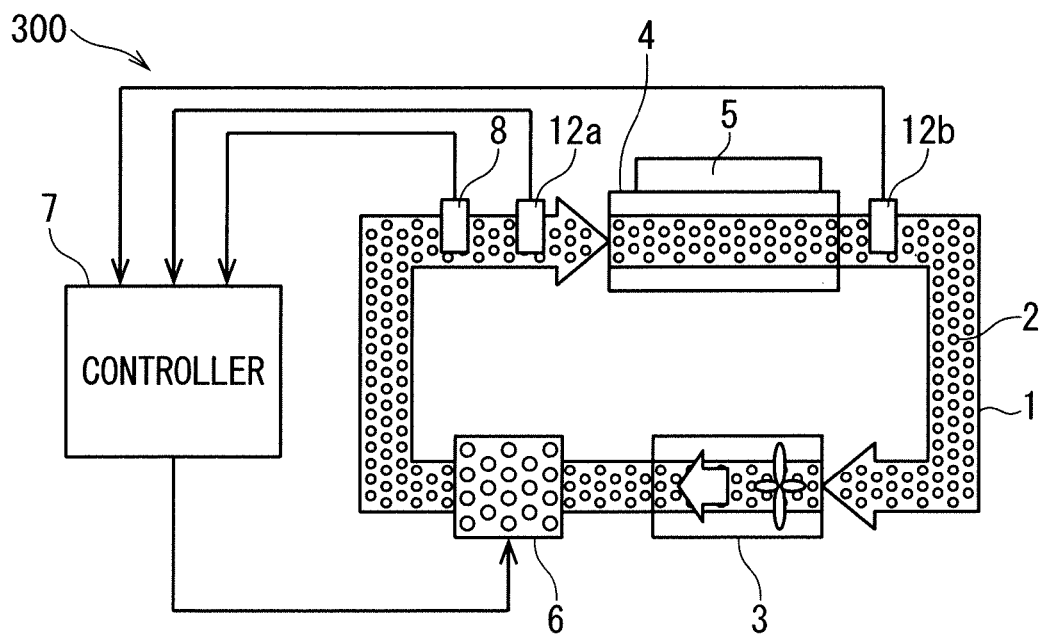
FIG. 8 A diagram schematically illustrating a configuration of a semiconductor cooling device according to Embodiment 3.

FIG. 8 is a diagram schematically illustrating a configuration of a semiconductor cooling device 300 according to Embodiment 3. The semiconductor cooling device 300 is provided with a refrigerant temperature sensor 8 that detects a refrigerant temperature Tw at arbitrary positions of the refrigerant circulation path 1, a refrigerant pressure sensor 12a that measures a refrigerant pressure Pa at a refrigerant inlet of the cooling fins 4, and a refrigerant pressure sensor 12b that measures a refrigerant pressure Pb at a refrigerant outlet of the cooling fins 4.

The controller 7 controls the output of the microbubble generator 6 based on the refrigerant temperature Tw and a refrigerant pressure difference $\Delta P=Pb-Pa$.

Figure 9:
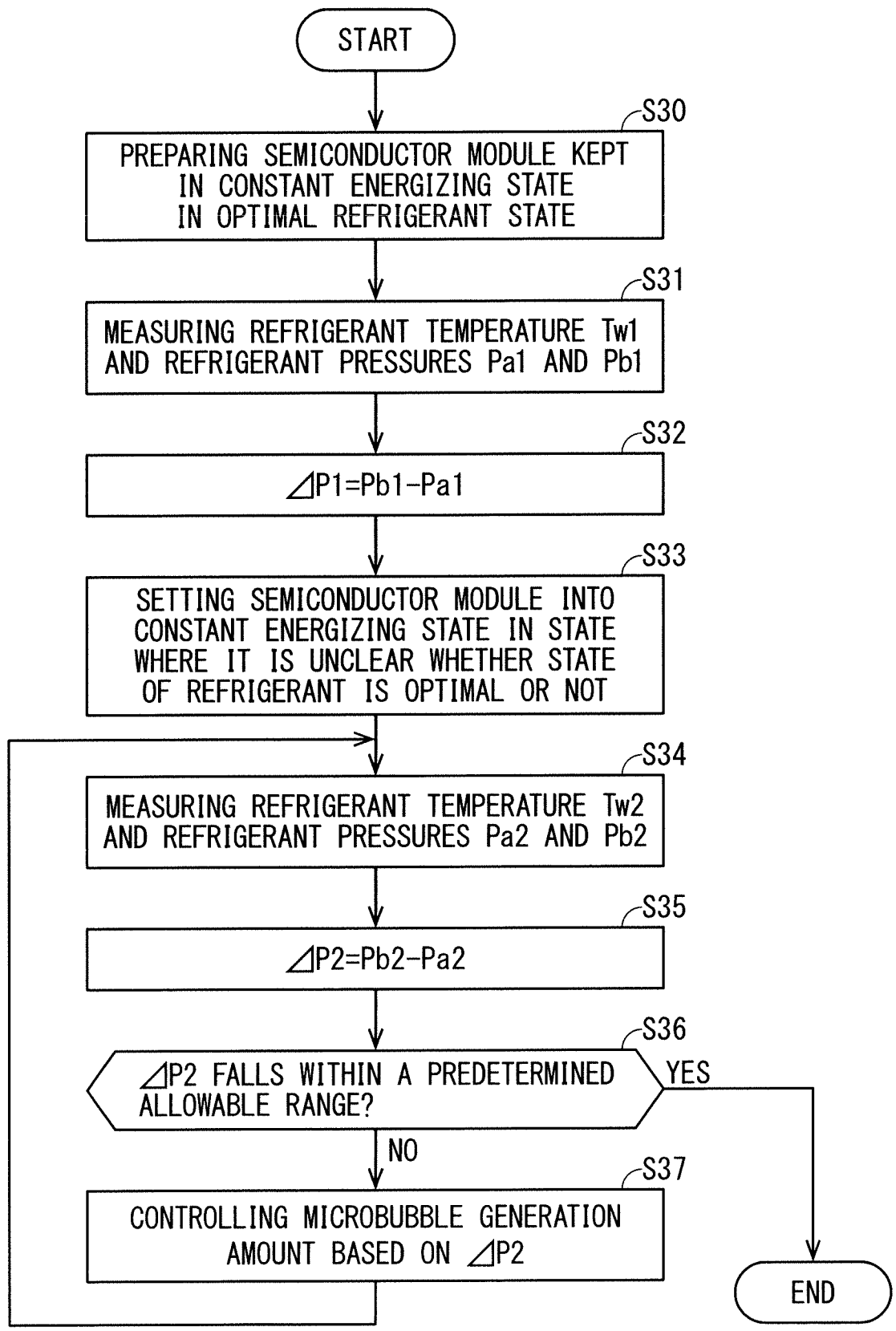
FIG. 9 A flowchart illustrating a control method of a mixing amount of microbubbles according to Embodiment 3.

Next, an operation of the semiconductor cooling device 300 and a control method of the mixing amount of microbubbles will be described. FIG. 9 is a flowchart illustrating the control method of the mixing amount of microbubbles according to Embodiment 3.

First, in Step S30, a state in which the mixing amount of microbubbles contained in the refrigerant 2 is optimal is prepared. In the state of the optimal refrigerant 2, the semiconductor module 5 is kept in a given constant energizing state.

In Step S31, the controller 7 obtains a refrigerant temperature Tw1 measured by the refrigerant temperature sensor 8, a refrigerant pressure Pa1 measured by the refrigerant pressure sensor 12a, and a refrigerant pressure Pb1 measured by the refrigerant pressure sensor 12b. At this point, the controller 7 preferably obtains a plurality of refrigerant pressures Pa1 and a plurality of refrigerant pressures Pb1 for a plurality of refrigerant temperatures Tw1.

In Step S32, the controller 7 calculates $\Delta P1=Pb1-Pa1$ which represents a pressure difference between the refrigerant pressure Pa1 and the refrigerant pressure Pb1. $\Delta P1$ indicates the magnitude of the pressure loss reduction effect in a state where the mixing amount of the microbubbles is optimal. In Step S31, a plurality of refrigerant pressures Pa1 and a plurality of refrigerant pressures Pb1 for a plurality of refrigerant temperatures Tw1 are obtained; therefore, the correlation between the refrigerant temperature Tw1 and $\Delta P1$ is obtained. The controller 7 stores correlation data between the acquired refrigerant temperature Tw1 and $\Delta P1$ in the memory as reference data.

In step S33, in a state where it is unclear whether the state of the refrigerant 2 is optimal or not, that is, the state of the mixing amount of the microbubbles is optimal or not, since the time has elapsed from Step S31, the semiconductor module 5 is driven in the same state as the constant energizing state in which the reference data is acquired.

In Step S34, the controller 7 obtains a refrigerant temperature Tw2 measured by the refrigerant temperature sensor 8, a refrigerant pressure Pa2 measured by the refrigerant pressure sensor 12a, and a refrigerant pressure Pb2 measured by the refrigerant pressure sensor 12b.

In Step S35, the controller 7 calculates $\Delta P2=Pb2-Pa2$ which represents a pressure difference between the refrigerant pressure Pa2 and the refrigerant pressure Pb2.

In Step S36, the controller 7 determines whether the calculated $\Delta P2$ falls within a predetermined allowable range or not. When $\Delta P2$ falls within the allowable range, that is, YES in Step S36, the control method is ended. When $\Delta P2$ exceeds the allowable range, that is, NO in Step S36, the control method proceeds to Step S37.

Figure 10:
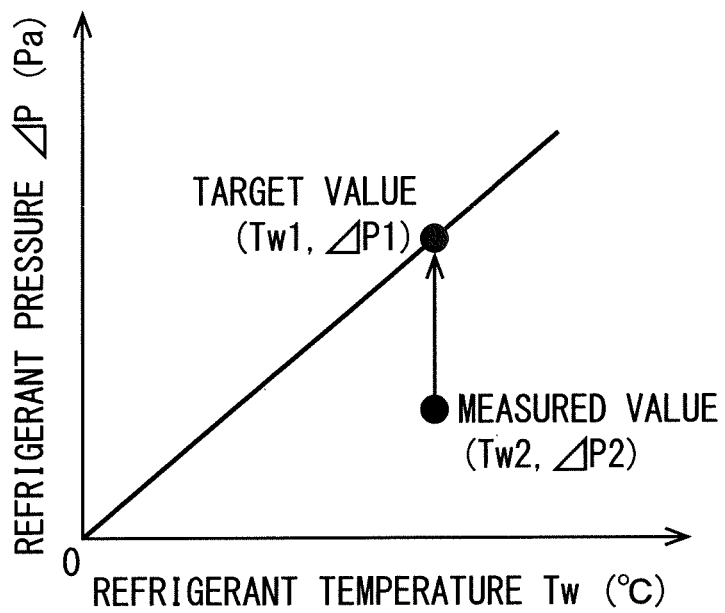
FIG. 10 A graph illustrating a correlation between a refrigerant temperature and $\Delta P1$ in an optimal refrigerant state.

In Step S37, the controller 7 drives the microbubble generator 6. FIG. 10 illustrates a correlation between the refrigerant temperature Tw1 and $\Delta P1$ acquired in Step S32 in the optimal refrigerant state. Also, in FIG. 7, the refrigerant temperature Tw2 acquired in Step S34 and $\Delta P2$ calculated in step S35 are illustrated. The controller 7 controls the generation amount of microbubbles so that the values of the refrigerant temperature Tw2 and the refrigerant pressure difference $\Delta P2$ approach the target value on the graph illustrating the relation between the refrigerant temperature Tw1 and the refrigerant pressure difference ΔP1. This control is repeatedly performed from Step S34 to Step S37 until the values converge in the allowable range including the target value. As a result, the mixing amount of microbubbles contained in the refrigerant 2 recovers to the optimal state.

Summarizing above, the refrigerant sensor included in the semiconductor cooling device 300 includes the refrigerant temperature sensor 8 that measures the refrigerant temperature Tw and the refrigerant pressure sensors that measure refrigerant pressures at the respective positions in the refrigerant circulation path 1. In Embodiment 3, the refrigerant pressure sensor 12a that measures a refrigerant pressure Pa at a refrigerant inlet of the cooling fins 4, and the refrigerant pressure sensor 12b that measures a refrigerant pressure Pb at a refrigerant outlet of the cooling fins 4. The controller 7 controls the microbubble generator 6 based on the refrigerant temperature Tw measured by the refrigerant temperature sensor 8 and the refrigerant pressure Pa and the refrigerant pressure Pb measured by the refrigerant pressure sensor 12a and the refrigerant pressure sensor 12b, respectively.

With such a configuration, the semiconductor cooling device 300 keeps the mixing amount of the microbubbles contained in the refrigerant 2 in the optimal state. That is, the semiconductor cooling device 300 reduces the pressure loss of the refrigerant 2 and ensures to increase the flow velocity of the refrigerant 2. As a result, the thermal resistance Rth (j_w) between the semiconductor module 5 and the refrigerant 2 is reduced, and the heat radiation effect is improved.

Embodiment 4

A semiconductor cooling device according to Embodiment 4 includes a semiconductor cooling device in which, among the configuration of the semiconductor cooling device 100 in Embodiment 1, the configuration of the semiconductor cooling device 200 in Embodiment 2, and the configuration of the semiconductor cooling device 300 in Embodiment 3 described above, any of the two configurations are combined or a semiconductor cooling device including all of the configurations.

The semiconductor cooling device in Embodiment 4 recovers the mixed concentration of microbubbles in the refrigerant circulation path 1 by controlling the microbubble generator 6 to control the reduction in the mixed concentration of microbubbles in the refrigerant 2 which has been reduced due to collapse or the like, with the configuration in which any of the two configurations of the refrigerant sensors are combined or the configuration in which all of refrigerant sensors are combined.

Embodiment 5

Figure 11:
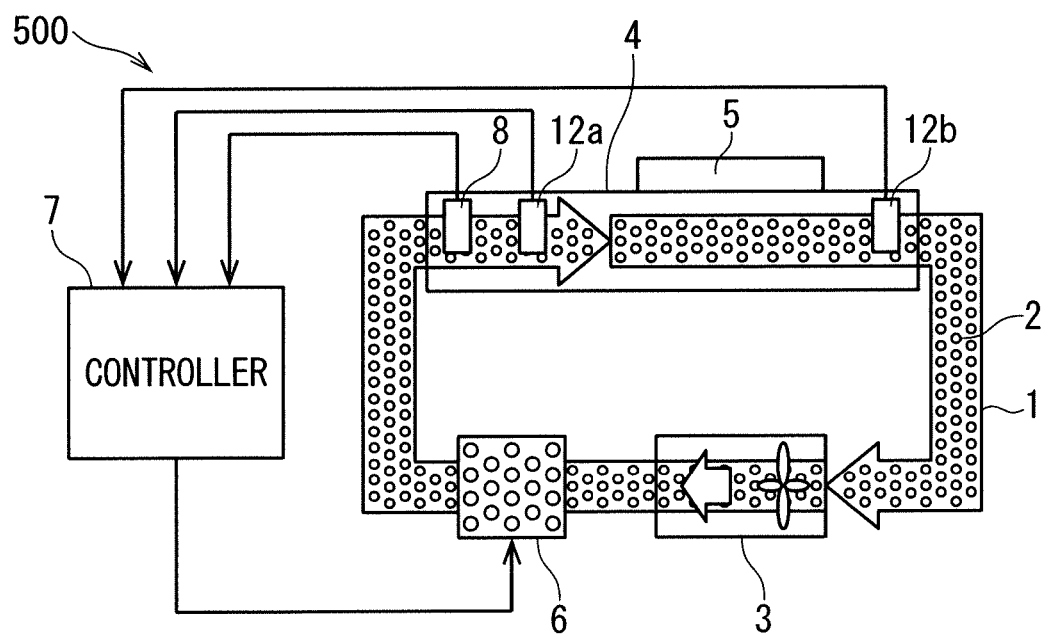
FIG. 11 A diagram schematically illustrating a configuration of a semiconductor cooling device according to Embodiment 5.

A semiconductor cooling device according to Embodiment 5 will be described. FIG. 11 is a diagram schematically illustrating a configuration of a semiconductor cooling device 500 according to Embodiment 5.

As in the same with the semiconductor cooling device 300 described in Embodiment 3, the semiconductor cooling device 500 includes a refrigerant temperature sensor 8, a refrigerant pressure sensor 12a, and a refrigerant pressure sensor 12b. However, the refrigerant temperature sensor 8, the refrigerant pressure sensor 12a, and the refrigerant pressure sensor 12b are built in the cooling fins 4 that is a heat exchanger.

With such a configuration, the construction of piping for the cooling system constituting the refrigerant circulation path 1 is simplified. Further, the refrigerant sensor measures the state of the refrigerant 2 located in the heat exchanger; therefore, the decrease in the pressure loss reduction effect and the decrease in the heat radiation effect of the refrigerant 2 are accurately detected.

The semiconductor cooling device in which the refrigerant temperature sensor 8 included in the semiconductor cooling device 100 described in Embodiment 1 is built in the cooling fins 4 also exhibits the same effect described above. The semiconductor cooling device in which the refrigerant temperature sensor 8, and the refrigerant flow rate sensor 10 or the refrigerant flow velocity sensor 11 included in the semiconductor cooling device 200 described in Embodiment 2 are built in the cooling fins 4 also exhibits the same effect described above.

Embodiment 6

Figure 12:
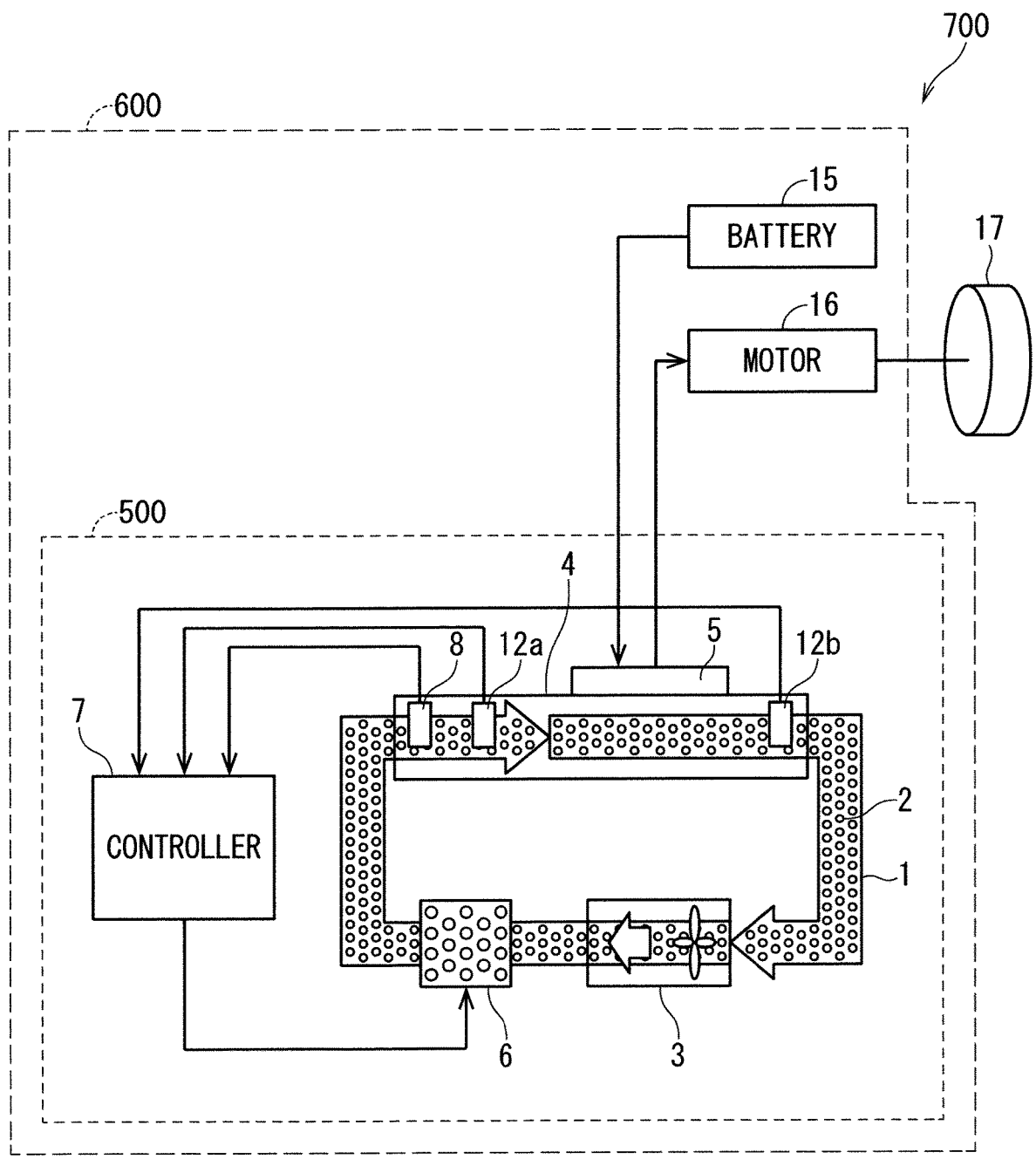
FIG. 12 A diagram schematically illustrating a configuration of a power control system and a travelling body according to Embodiment 6.

A power control system and a travelling body according to Embodiment 6 will be described. FIG. 12 is a diagram schematically illustrating a configuration of a power control system 600 and a travelling body 700 according to Embodiment 6.

The power control system 600 includes the semiconductor cooling device 500 described in Embodiment 5, the semiconductor module 5 installed in the cooling fins 4 of the semiconductor cooling device 500, a battery 15 for supplying the semiconductor module 5 with power as a primary side power source, and a motor 16 driven by power controlled by the semiconductor module 5.

The travelling body 700 includes the power control system 600, and a wheel 17 driven by the motor 16 included in the power control system. The power control system 600 is controlled by a host controller of the travelling body 700.

With such a configuration, the semiconductor cooling device 500 prevents the deterioration of the thermal resistance Rth (j_w) between of the semiconductor device included in the semiconductor module 5 and the refrigerant 2 circulating in the refrigerant circulation path 1, and extends the life of the semiconductor module 5, As a result, the improvement of reliability and the extended life of the power control system 600 and the travelling body 700 are ensured.

Further, the power control system or the travelling body provided with the semiconductor cooling device described in any of Embodiments 1 to 4, in place of the semiconductor cooling device 500, also exhibits the same effect as described above.

It should be noted that Embodiments of the present invention can be arbitrarily combined and can be appropriately modified or omitted without departing from the scope of the invention. While the invention has been described in detail, the forgoing description is in all aspects illustrative and not restrictive. It is understood that numerous other modifications and variations can be devised departing from the scope of the invention.

EXPLANATION OF REFERENCE SIGNS

1 refrigerant circulation path, 2 refrigerant, 3 circulator, 4 cooling fins, 5 semiconductor module, 6 microbubble generators, 7 controller, 8 refrigerant temperature sensor, 9 module temperature sensor, 10 refrigerant flow rate sensors 11 refrigerant flow velocity sensor, 12a refrigerant pressure sensor, 12b refrigerant pressure sensor, 15 battery, 16 motor, 17 wheel, 100 semiconductor cooling device, 500 semiconductor cooling device, 700 power control systems, 800 travelling body, L refrigerant flow rate, Pa refrigerant pressure, Pb refrigerant pressure, Tj module temperature, Tw refrigerant temperature, V refrigerant flow velocity.

The invention claimed is:

1. A semiconductor cooling device, comprising:
    a refrigerant circulation path through which refrigerant circulates;
    a heat exchanger provided on the refrigerant circulation path on which a semiconductor module is installable and configured to exchange heat between the refrigerant and the semiconductor module;
    a microbubble generator provided on the refrigerant circulation path, and configured to generate microbubbles in the refrigerant;
    a controller configured to control the microbubble generator; and
    at least one refrigerant sensor configured to measure a refrigerant temperature, a refrigerant flow rate, a refrigerant flow velocity, or a refrigerant pressure of the refrigerant circulating in the refrigerant circulation path, wherein
    the controller is configured to control the microbubble generator based on a measurement result measured by the at least one refrigerant sensor to control a generation amount of the microbubbles;
    the at least one refrigerant sensor includes a refrigerant temperature sensor configured to measure the refrigerant temperature, and refrigerant pressure sensors configured to measure the refrigerant pressure at respective positions in the refrigerant circulation path; and
    the controller is configured to control the microbubble generator based on the refrigerant temperature measured by the refrigerant temperature sensor and the refrigerant pressures measured by the respective refrigerant pressure sensors.

2. The semiconductor cooling device according to claim 1, wherein
    the at least one refrigerant sensor is built in the heat exchanger.

3. The semiconductor cooling device according to claim 1, further comprising
    a module temperature sensor configured to measure a module temperature of the semiconductor module that is installable in the heat exchanger, wherein
    the controller is configured to control the microbubble generator based on the module temperature measured by the module temperature sensor.

4. The semiconductor cooling device according to claim 1, wherein
    the controller includes an input terminal for inputting a signal related to a module temperature of the semiconductor module that is installable in the heat exchanger, and
    the controller is configured to control the microbubble generator based on the signal input by the input terminal.

5. The semiconductor cooling device according to claim 1, wherein
    the at least one refrigerant sensor includes a refrigerant flow rate sensor configured to measure the refrigerant flow rate, and
    the controller is configured to control the microbubble generator based on the refrigerant flow rate measured by the refrigerant flow rate sensor.

6. The semiconductor cooling device according to claim 1, wherein
    the at least one refrigerant sensor includes a refrigerant flow velocity sensor configured to measure the refrigerant flow velocity, and
    the controller is configured to control the microbubble generator based on the refrigerant flow velocity measured by the refrigerant flow velocity sensor.

7. A power control system, comprising:
    the semiconductor cooling device according to claim 1;
    a semiconductor module installed on the heat exchanger;
    a battery configured to supply the semiconductor module with power; and
    a motor driven by the power controlled by the semiconductor module.

8. A travelling body, comprising:
    the power control system according to claim 7: and
    a wheel configured to be driven by the motor.

* * * * *